United States Patent
Simpson

[19]

[11] Patent Number: 6,158,887
[45] Date of Patent: Dec. 12, 2000

[54] CORRECTION FOR PARASITIC VOLTAGES IN RESISTANCE THERMOMETRY

[75] Inventor: Alan Fernley Simpson, Oxford, United Kingdom

[73] Assignee: Oxford Instruments (UK) Limited, Oxon, United Kingdom

[21] Appl. No.: 09/258,264

[22] Filed: Feb. 26, 1999

[30] Foreign Application Priority Data

Mar. 10, 1998 [EP] European Pat. Off. .............. 98301743

[51] Int. Cl.⁷ .................................................. G01K 7/24
[52] U.S. Cl. ............................................................ 374/183
[58] Field of Search ............................................ 374/183

[56] References Cited

U.S. PATENT DOCUMENTS

| | | | |
|---|---|---|---|
| 3,978,471 | 8/1976 | Kelly | 341/118 |
| 4,025,847 | 5/1977 | Washburn | 374/183 |
| 4,041,382 | 8/1977 | Washburn | 374/183 |
| 4,114,446 | 9/1978 | Walsh | 374/183 |
| 5,228,781 | 7/1993 | Robinson | 374/183 |
| 5,351,010 | 9/1994 | Leopold | 374/183 |
| 5,876,122 | 3/1999 | Eryurek | 374/183 |

FOREIGN PATENT DOCUMENTS

| | | |
|---|---|---|
| 0 261 526 | 3/1988 | European Pat. Off. . |
| 239 879 | 10/1986 | Germany . |
| WO 85 00711 | 2/1985 | WIPO . |

OTHER PUBLICATIONS

A.A. Redkokasha E. A., "Resistance–Voltage Converters for SM–1 and SM–2 Computers" Measurement Techniques, vol. 27, No. 8, Aug. 1984, New York, pp. 744–745, XP–002071397.

*Primary Examiner*—Diego Gutierrez
*Assistant Examiner*—Stanley J. Pruchnic, Jr.

[57] ABSTRACT

An apparatus employing a method for measuring the temperature of a sensor (Rx) having a resistance which varies in accordance with the temperature of the sensor, using a switching sequence to apply a parasitic voltage correction signal to the input of an amplifier in the measurement circuit whereby the sensor generates an offset response signal which is amplified and adjusted to substantially minimize the amplified offset response signal. The temperature of the sensor is calculated from the amplified response signal in accordance with a predetermined algorithm.

10 Claims, 3 Drawing Sheets

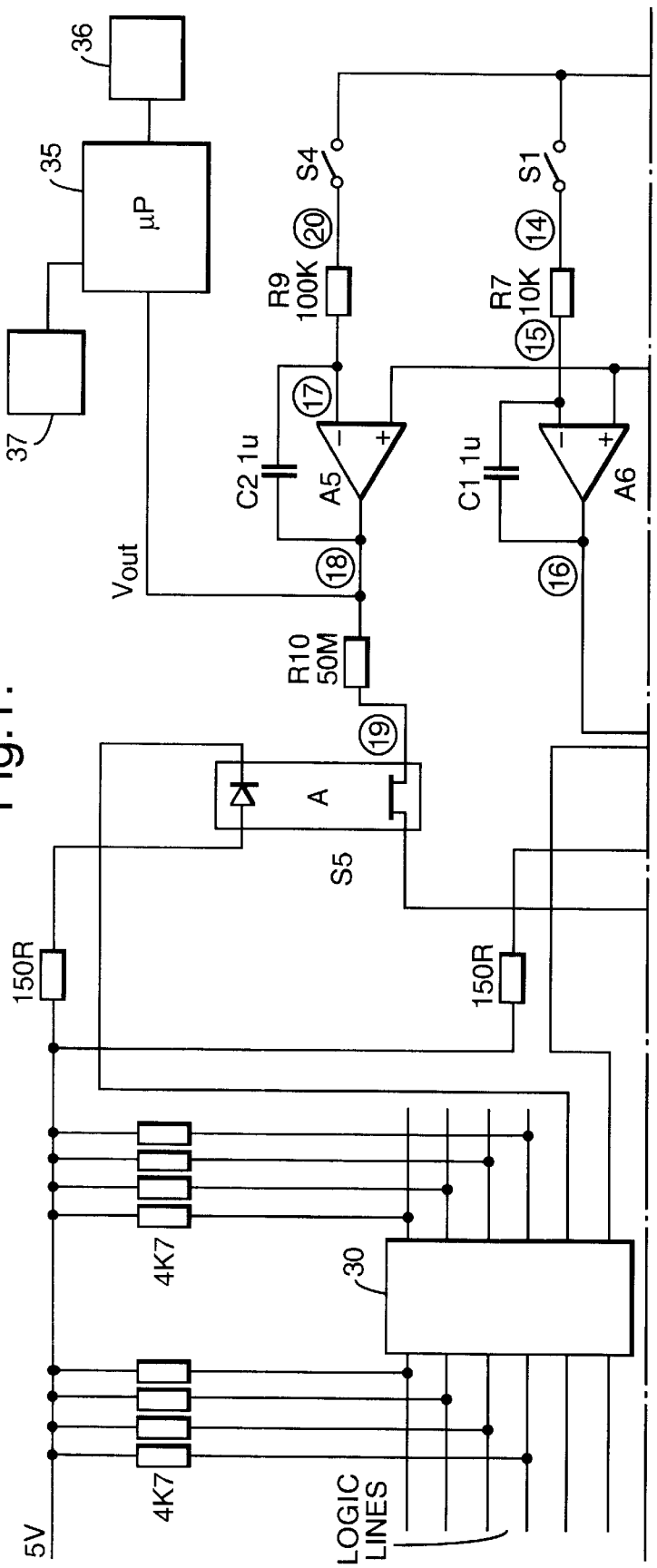

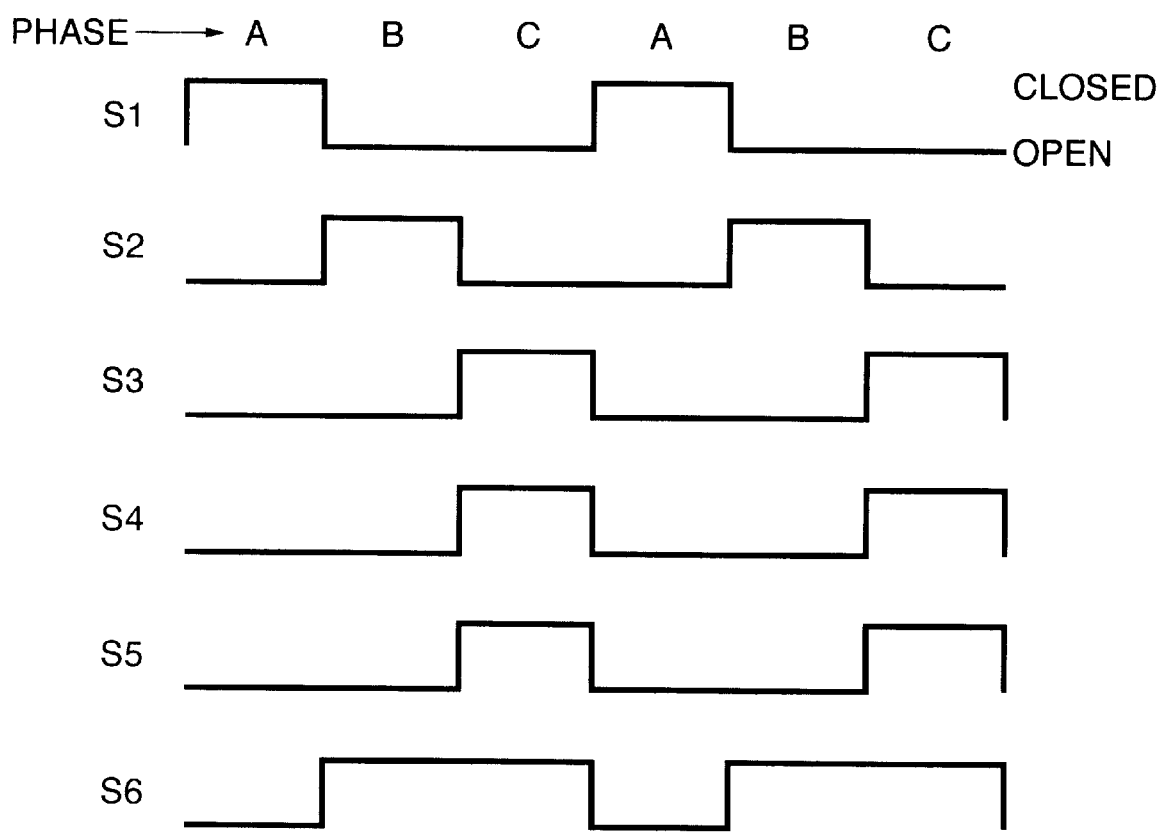

CORRECTION FOR PARASITIC VOLTAGES IN RESISTANCE THERMOMETRY

FIELD OF THE INVENTION

The present invention relates to a method and apparatus for measuring the temperature of a sensor having a resistance which varies in accordance with the temperature of the sensor.

DESCRIPTION OF THE PRIOR ART

In order to measure the resistance of a sensor it is necessary to pass a current through the sensor and measure the voltage developed across the sensor by this voltage. Ohms Law then allows the resistance (or it's reciprocal, conductance) to be measured from the ratio of voltage to current. The current used may be either direct current (DC) or alternating current (AC).

Direct current is easy to implement and has the advantage that the wires to the sensor may be heavily filtered to remove sensor heating due to AC current picked up from the environment. However any DC voltage measurement is subject to a number of errors. These may be caused by imperfections (offset voltage, offset current and bias current) in the electrical circuit used to measure the voltage and by thermocouple and other parasitic effects in the wiring used to connect to the sensor. At the extremely low sensor excitation levels required to prevent sensor heating, these errors will swamp the very small signals that must be measured. However high the quality of the amplifier used to detect the signals, the parasitic effects will cause problems.

Conventionally alternating current is used to overcome these problems. However this introduces problems of its own. At the relatively high resistance of the sensors being measured, stray capacitance on the wiring to the sensor and across the sensor itself introduces errors. Moreover it is no longer possible to filter the sensor leads to prevent unwanted pick up from the environment, since such filtering would prevent the measuring signals reaching the sensor.

Alessandrello et al. in Cryogenics 1997 Volume 37, Number 1 (pages 27–31) describe a method of correcting for offset current in a measurement circuit amplifier by adding an additional measuring step. However the effects of parasitic voltages are not dealt with in the circuit of Alessandrello et al.

SUMMARY OF THE INVENTION

In accordance with a first aspect of the present invention there is provided a method of measuring the temperature of a sensor having a resistance which varies in accordance with the temperature of the sensor, the method comprising:

1) performing a temperature measurement (phase C) with a measurement circuit by:
    a) applying a probe signal to the sensor whereby the sensor generates a response signal;
    b) amplifying the response signal with an amplifier to generate an amplified response signal; and
    c) calculating the temperature of the sensor from the amplified response signal in accordance with a predetermined algorithm, characterised in that the method further comprises:
2) correcting for parasitic voltages in the measurement circuit (phase B) by:
    a) applying a parasitic voltage correction signal to the measurement circuit whereby the sensor generates an offset response signal;
    b) amplifying the offset response signal with said amplifier to generate an amplified offset response signal; and
    c) adjusting the parasitic voltage correction signal whereby the amplified offset response signal is substantially minimised.

The present invention provides a method of correcting for parasitic voltages which may be caused by thermal, electrochemical or piezoelectric effects. This increases the accuracy of the temperature measurement.

Typically the probe signal is a DC signal.

The parasitic voltage correction signal may be saved in a computer memory or in a sample-and-hold circuit. The adjustment in step 2) c) is typically performed by means of a first feedback loop including the amplifier.

Typically the probe signal is low pass filtered to remove high frequency noise from the probe signal.

Steps 1) a) and 2) c) may be performed simultaneously but preferably steps 1) a) and 2) c) are performed in sequence.

Typically the method further comprises
3) correcting for current errors associated with said amplifier (phase A) by:
    a) applying an offset current correction signal to said amplifier;
    b) amplifying the offset current correction signal with said amplifier to generate an amplified offset current correction signal; and
    c) adjusting the offset current correction signal whereby the amplified offset current correction signal is substantially minimised.

Typically step 3) is performed with the sensor disconnected from the amplifier.

The offset current correction signal may be saved in a computer memory or in a sample-and-hold circuit. The adjustment in step 3) c) is typically performed by means of a second feedback loop including the amplifier.

Two or more of steps 1), 2) and 3) may be performed simultaneously but preferably steps 1) a), 2) c) and 3) c) are performed in sequence. In this case preferably step 2) c) is carried out before step 1) a) and step 3) c) is carried out before step 2) c).

Typically the amplifier has one or more amplifier inputs (eg an inverting input and a non-inverting input). In one embodiment the offset current correction signal and the parasitic voltage correction signal are applied to different amplifier inputs. However in a preferred embodiment the offset current correction signal and the parasitic voltage correction signal are applied to the same amplifier input (preferably the inverting input) whereby the current and voltage errors are corrected independently in steps 2) and 3).

Typically the measurement circuit comprises one or more optically isolated switches and the method further comprises switching between said steps 1), 2) and/or 3) by optically controlling one or more of said optically isolated switches. This minimizes leakage from the switch(es) into the measurement circuit.

Typically said measurement circuit is configured such that substantially no current flows through said sensor at the end of step 2) c).

In accordance with a second aspect of the present invention there is provided apparatus for measuring the temperature of a sensor by a method according to any of the preceding claims, the apparatus comprising:

1) a measurement circuit comprising:
   a) means for applying a probe signal to the sensor whereby the sensor generates a response signal;
   b) an amplifier for amplifying the response signal to generate an amplified response signal; and
   c) means for calculating the temperature of the sensor from the amplified response signal in accordance with a predetermined algorithm, characterised in that the apparatus further comprises:
2) means for correcting for parasitic voltages in the measurement circuit comprising:
   a) means for applying a parasitic voltage correction signal to the measurement circuit whereby the sensor generates an offset response signal,
   b) wherein the amplifier is arranged to amplify the offset response signal to generate an amplified offset response signal; and
   c) means for adjusting the parasitic voltage correction signal whereby the amplified offset response signal is substantially minimized.

BRIEF DESCRIPTION OF THE DRAWINGS

Examples of the present invention will now be described with reference to the accompanying drawings, in which:

FIG. 2 is a simplified control sequence timing diagram.

DETAILED DESCRIPTION OF THE EMBODIMENTS

Figure 1:
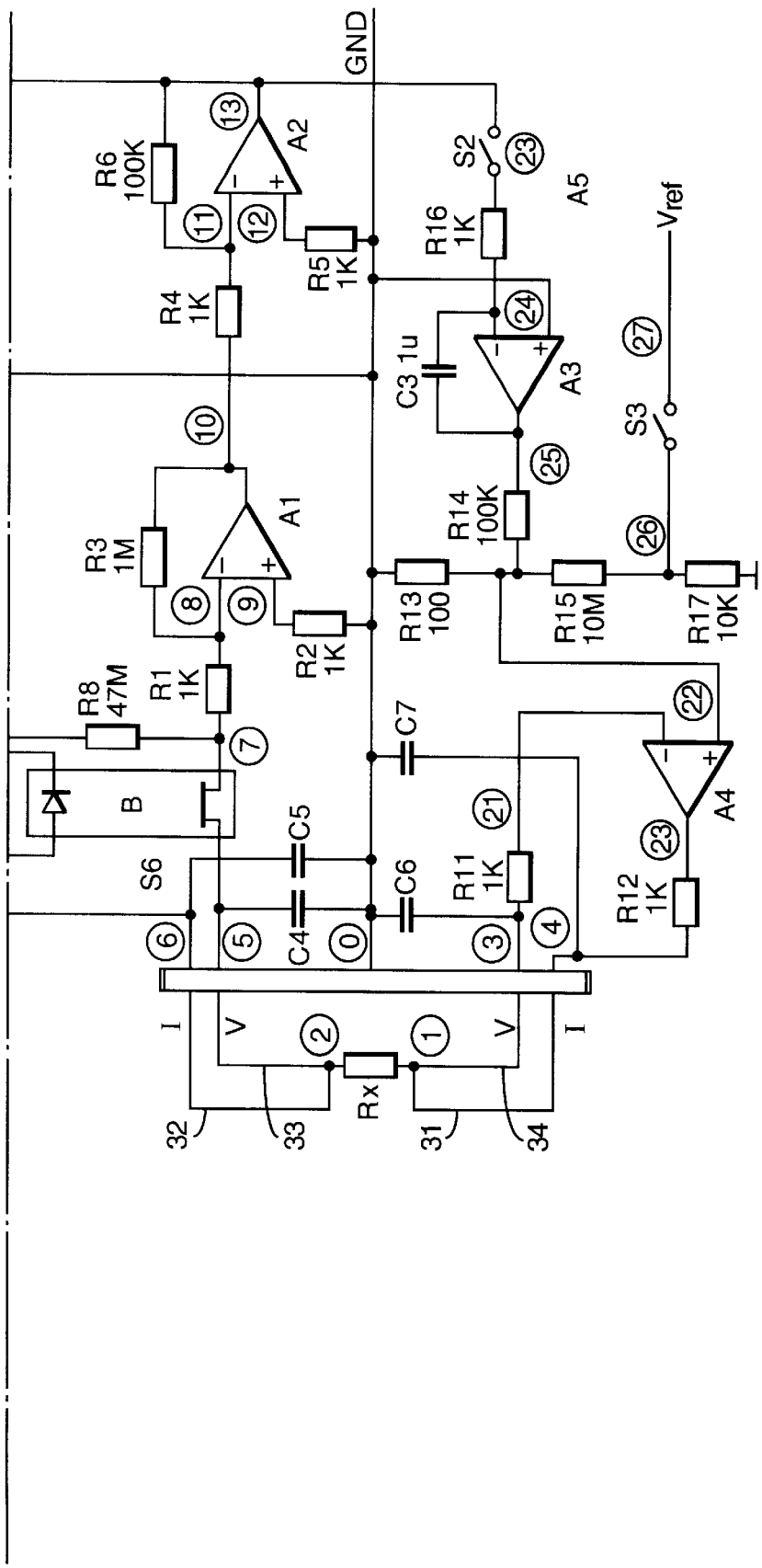
FIG. 1 and FIG. 1 (Cont) is a simplified schematic diagram of a measurement circuit for performing low power thermometry at ultra-low temperatures.

Referring to FIG. 1, the circuit nodes are given numbers in circles to allow easy identification. Node 0 is at "ground" potential with respect to this circuit.

Basics

Rx is the sensor resistor to be measured. It is located within a cryostat, remotely from the rest of the circuit at a temperature typically in the range of 5 mK to 10K. Four wires 31–34 are used to connect to this resistor and these run together within a single shielded cable. All these wires have 100 nF capacitors C4–C6 fitted, to prevent AC currents picked up on the leads passing through the sensor.

A1 and A2 together with resistors R1–R6 form a high gain, non-inverting, current-input amplifier with an overall conversion gain of $10^8$ volts per amp. (Thus a 10 nA change in the current flowing through R1, will result in a 1 volt change at its output, node 13). If this amplifier were "perfect", the presence of zero volts at node 13 would indicate that the input to the amplifier (i.e. node 7) is at exactly ground potential and that the current through R1 was precisely zero. In practice, offset voltages and currents associated with the amplifier will make neither of these statements true. Part of the task of the measuring sequence is to correct for this.

S1–S6 are all solid state switches. They are closed at the appropriate time in the measuring sequence, as indicated by the simplified control sequence timing diagram shown in FIG. 2. The switching signals are generated by a standard logic counter circuit 30. The precise timing of the switching signals is set out below in Table 1.

TABLE 1

| TIME (S) | SWITCHING SIGNAL |
|---|---|
| 0.0 | ALL OPEN |
| 0.1 | S1 CLOSE |
| 0.9 | S1 OPEN |
| 1.0 | S6 CLOSE |
| 1.1 | S2 CLOSE |
| 1.9 | S2 OPEN |
| 2.0 | S3, S5 CLOSE |
| 2.1 | S4 CLOSE |
| 2.9 | S4 OPEN |
| 2.99 | S3, S5 OPEN |
| 3.0 | S6 OPEN |

Switches S1 to S4 are handling relatively large signals and are standard monolithic CMOS switches. Switches S5 and S6 are connected directly in the measuring circuit. For these it is important that there is no leakage from the switch driving circuit into the switched circuit. Optically isolated FET switches are used to achieve this.

A3, A5 and A6 together with input resistors R7, R9 and R16 and capacitors C1–C3 are each current integrators. Their output is equal to the time integral of the current flowing through their input resistor and its associated switch S1, S3, S4. When this switch is open the output of the associated amplifier remains constant.

$V_{ref}$ is a fixed 5V DC reference voltage generated by standard means.

Phase A

Offset Current Correction

Switch S1 is closed while all other switches S2–S5 remain open. Because A1 is not perfect, some small offset current must flow through R1 in order to bring node 13 to zero volts. If node 13 is not at zero, current will flow through R7, causing node 16 to ramp up or down. This will result in a small current flow through R8 and R1. A steady state will be established when the offset current correction signal provided by the current passing through R8 exactly equals the offset current of A1 and node 13 reaches zero. No further current will flow through R7 and node 16 will remain stable. Hence the current through R8 will remain stable at a value matching the offset current of A1. When S1 opens, this current will continue to flow. Phase A has now nulled all current errors associated with the amplifier, but note that this does not mean that node 7 is necessarily at zero volts, since the amplifier offset voltage has not been nulled.

Phase B

Offset Voltage Correction

Switches S6 and S2 are closed. The current requirements of A1 are still being supplied via R8, so that if the voltage at node 7 remains at the same value as at the end of phase A no current will flow through S6 and the sensor, and node 13 will remain at zero volts. The voltage at node 7 is determined by the voltage at node 22 (i.e. the voltage across R13) plus the sum of all the thermocouple voltages associated with the sensor wires 31–34 together with any offsets associated with A4. If node 13 is not initially at zero at the start of phase B, the output of A3 (ie. node 25) provides a parasitic voltage offset correction signal which will ramp up or down, adjusting the voltage across R13 until node 13 reaches zero, and the condition above is now satisfied. This has now compensated for all voltage offsets within both the measurement circuit and the sensor Rx. Note that there is now no current flowing through the sensor Rx. When S2 opens at the end of phase B, the offset voltage compensation will be retained at node 25.

Phase C

Conductance Measurement

Switches S3, S4 and S5 are now closed, and S6 remains closed. Closing S3 provides a small known voltage change Vref across R13 (typically 50 $\mu$V). If the voltage at node 7 is to remain unchanged, this 50 $\mu$V must appear across the sensor resistor Rx. Therefore Vref provides a probe signal which is applied to the sensor whereby the sensor Rx generates a response signal comprising a flow of current through Rx, the value of which is proportional to the sensor conductance (reciprocal of sensor resistance). This current must be supplied via R10, since A1's current requirement is still being provided via R8. Hence the voltage across R10 gives a direct measure of the sensor conductance. This forms the output voltage of the circuit Vout which is an analogue voltage directly proportional to the conductance of the sensor Rx. Vout is monitored by a microprocessor 35. The temperature vs conductance curve of the sensor Rx is previously determined in a calibration procedure and stored in memory 37. The microprocessor 35 calculates the temperature of the sensor Rx in accordance with the value of Vout and the calculated temperature is output on a display 36.

Use of the integrator A5 allows Vout to be retained when S4 is open during phases A and B. So the microprocessor 35 sees a steady output voltage proportional to conductance, which is updated each cycle during phase C. The only residual errors are due to the offset of node 7 from ground and thermocouple effects in the upper leads to the sensor. But the effect of these is as a fraction of the output voltage (typically 5v) rather than the measuring voltage (typically 50 $\mu$V) i.e. reduced by a factor of $10^5$. As an added refinement (not shown in FIG. 1), these too can be eliminated by placing a standard offset nulling potentiometer across A1. In a previous calibration procedure, phases A, B and C are run with the sensor Rx open circuited (i.e. with S6 open). The voltage applied by the offset nulling potentiometer is then adjusted until the output voltage at node 18 (Vout) reaches zero. This ensures that the voltage at node 7 during operation remains truly at zero volts.

The circuit of FIG. 1 works close to DC and fully compensates for electronic offset, drift and thermoelectric effects. The sensor excitation levels are very low and do not self heat the sensor. The circuit has measured the conductance of an $RuO_2$ sensor at a temperature of 5 mK (approximately 200,000 ohms). The circuit can be used to track the temperature of the mixing chamber of a dilution refrigerator down to its base temperature.

In a less preferred alternative embodiment (not shown) the voltage offset correction is introduced across R2 instead of across R13. This is still within the phase B circuit loop R1,A1,R2,R13,A4/R12/R11,Rx,S6 and the phase B criterion is still to minimise the amplifier output voltage.

The disadvantage of the alternative embodiment is that it interacts with the phase A offset current measurement as follows. Provided the voltage at node 7 does not move, R8 will then provide a constant correction current set by ohm's law. If the offset voltage correction is applied across R2 this will result in an equivalent voltage change at node 8 and hence at node 7. So the voltage across R8 will change slightly and so will the current being supplied.

In contrast, by changing nothing across R2 (as in the embodiment of FIG. 1) the voltage at node 9 will stay the same relative to ground in each phase. Hence when the amplifier output is at zero (as it is by the end of each phase) the voltage at nodes 7 and 8 will stay constant for every phase. Hence the offset correction current being supplied via R8 will remain constant and the corrections for both parasitic voltages and parasitic currents will be truly independent of each other.

I claim:

1. A method of measuring the temperature of a sensor having a resistance which varies in accordance with the temperature of the sensor, the method comprising:
   1) performing a temperature measurement (phase C) with a measurement circuit by:
      a) applying a probe signal to the sensor whereby the sensor generates a response signal;
      b) amplifying the response signal with an amplifier to generate an amplified response signal; and
      c) calculating the temperature of the sensor from the amplified response signal in accordance with a predetermined algorithm, characterised in that the method further comprises:
   2) correcting for parasitic voltages in the measurement circuit (phase B) by:
      a) applying a parasitic voltage correction signal to the measurement circuit whereby the sensor generates an offset response signal;
      b) amplifying the offset response signal with said amplifier to generate an amplified offset response signal; and
      c) adjusting the parasitic voltage correction signal whereby the amplified offset response signal is substantially minimized.

2. A method according to claim 1, wherein steps 1) a) and 2) c) are performed in sequence.

3. A method according to claim 1, further comprising
   3) correcting for current errors associated with said amplifier (phase A) by:
      a) applying an offset current correction signal to said amplifier;
      b) amplifying the offset current correction signal with said amplifier to generate an amplified offset current correction signal; and
      c) adjusting the offset current correction signal whereby the amplified offset current correction signal is substantially minimized.

4. A method according to claim 3, wherein steps 1) a), 2) c) and 3) c) are performed in sequence.

5. A method according to claim 4, wherein step 2) c) is carried out before step 1) a); and step 3) c) is carried out before step 2) c).

6. A method according to claim 3, wherein said amplifier has one or more amplifier inputs; and wherein the offset current correction signal and the parasitic voltage correction signal are applied to the same amplifier input whereby the current and voltage errors are corrected independently in steps 2) and 3).

7. A method according to claim 1, wherein the measurement circuit comprises one or more optically isolated switches and the method further comprises switching between said steps 1), 2) and/or 3) by optically controlling one or more of said optically isolated switches.

8. A method according to claim 1, wherein said measurement circuit is configured such that substantially no current flows through said sensor at the end of step 2) c).

9. A method according to claim 1, further comprising low pass filtering the probe signal to remove high frequency noise from the probe signal.

10. Apparatus for measuring the temperature of a sensor by a method according to any of the preceding claims, the apparatus comprising:

1) a measurement circuit comprising:
    a) means for applying a probe signal to the sensor whereby the sensor generates a response signal;
    b) an amplifier for amplifying the response signal to generate an amplified response signal; and
    c) means for calculating the temperature of the sensor from the amplified response signal in accordance with a predetermined algorithm, characterised in that the apparatus further comprises:

2) means for correcting for parasitic voltages in the measurement circuit comprising:
    a) means for applying a parasitic voltage correction signal to the measurement circuit whereby the sensor generates an offset response signal,
    b) wherein the amplifier is arranged to amplify the offset response signal to generate an amplified offset response signal; and
    c) means for adjusting the parasitic voltage correction signal whereby the amplified offset response signal is substantially minimized.

* * * * *